(12) United States Patent
Ye et al.

(10) Patent No.: US 8,207,023 B2
(45) Date of Patent: Jun. 26, 2012

(54) METHODS OF SELECTIVELY DEPOSITING AN EPITAXIAL LAYER

(75) Inventors: Zhiyuan Ye, San Jose, CA (US); Saurabh Chopra, Santa Clara, CA (US); Yihwan Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/849,387

(22) Filed: Aug. 3, 2010

(65) Prior Publication Data

US 2011/0124169 A1 May 26, 2011

Related U.S. Application Data

(60) Provisional application No. 61/231,894, filed on Aug. 6, 2009.

(51) Int. Cl.
*H01L 21/00* (2006.01)
*H01L 21/84* (2006.01)
*H01L 21/7127* (2006.01)
*H01L 21/336* (2006.01)
*H01L 21/20* (2006.01)
*H01L 21/36* (2006.01)
*H01L 21/31* (2006.01)

(52) U.S. Cl. ........ 438/149; 438/199; 438/300; 438/488; 438/762; 438/929

(58) Field of Classification Search .................. 438/149, 438/199, 300, 488, 762, 969; 257/E21.09
See application file for complete search history.

(56) References Cited

U.S. PATENT DOCUMENTS

| 7,312,128 B2 | 12/2007 | Kim et al. |
| 2004/0171238 A1 | 9/2004 | Arena et al. |
| 2007/0287272 A1* | 12/2007 | Bauer et al. ................... 438/485 |
| 2009/0104739 A1 | 4/2009 | Ye et al. |

OTHER PUBLICATIONS

International Search Report and Written Opinion mailed May 2, 2011 for PCT Application No. PCT/US2010/044271.

* cited by examiner

*Primary Examiner* — William M. Brewster
(74) *Attorney, Agent, or Firm* — Moser Taboada; Alan Taboada (57) ABSTRACT

Methods for selectively depositing an epitaxial layer are provided herein. In some embodiments, providing a substrate having a monocrystalline first surface and a non-monocrystalline second surface; exposing the substrate to a deposition gas to deposit a layer on the first and second surfaces, the layer comprising a first portion deposited on the first surfaces and a second portion deposited on the second surfaces; and exposing the substrate to an etching gas comprising a first gas comprising hydrogen and a halogen and a second gas comprising at least one of a Group III, IV, or V element to selectively etch the first portion of the layer at a slower rate than the second portion of the layer. In some embodiments, the etching gas comprises hydrogen chloride (HCl) and germane ($GeH_4$).

20 Claims, 7 Drawing Sheets

METHODS OF SELECTIVELY DEPOSITING AN EPITAXIAL LAYER

CROSS-REFERENCE TO RELATED APPLICATIONS

This application claims benefit of U.S. provisional patent application Ser. No. 61/231,894, filed Aug. 6, 2009, which is herein incorporated by reference in its entirety.

FIELD

Embodiments of the present invention generally relate to methods of processing substrates.

BACKGROUND

A typical selective epitaxy process involves a deposition reaction and an etch reaction. The deposition reaction causes an epitaxial layer to be formed on monocrystalline surfaces of a substrate and a polycrystalline and/or amorphous layer to be formed on non-monocrystalline surfaces, for example, a patterned dielectric layer deposited atop the substrate. The etch reaction removes the epitaxial layer and the polycrystalline and/or amorphous layer at different rates, providing a net selective process that can result in deposition of an epitaxial material and limited, or no, deposition of polycrystalline material.

As the critical dimensions of devices continue to shrink, methods of selective epitaxial deposition, such as the exemplary method described above, require lower processing temperatures (e.g., about 600 degrees Celsius or less). Unfortunately, the inventors have observed that typical etching gases fail to provide a suitable selective window between the epitaxial layer and the polycrystalline and/or amorphous layer at such temperatures. While some etching gas mixtures have been discovered that can provide a suitable selective window, such gas mixtures operate at processing pressures substantially greater than the pressures used for the deposition reaction. Thus, process throughput is negatively affected due to disparity between processing pressures.

SUMMARY

Methods for selectively depositing an epitaxial layer are provided herein. In some embodiments, providing a substrate having a monocrystalline first surface and a non-monocrystalline second surface; exposing the substrate to a deposition gas to deposit a layer on the first and second surfaces, the layer comprising a first portion deposited on the first surfaces and a second portion deposited on the second surfaces; and exposing the substrate to an etching gas comprising a first gas comprising hydrogen and a halogen and a second gas comprising at least one of a Group III, IV, or V element to selectively etch the first portion of the layer at a slower rate than the second portion of the layer. In some embodiments, the etching gas comprises hydrogen chloride (HCl) and germane (GeH$_4$).

The invention methods can be utilized in the fabrication of a semiconductor device. In some embodiments, a method of fabricating a semiconductor device includes forming a gate stack having a non-monocrystalline surface on a substrate; etching the substrate on opposite sides of the gate stack to define a channel region, wherein the etched regions formed in the substrate have monocrystalline surfaces; exposing the substrate and gate stack to a deposition gas to deposit a layer on the non-monocrystalline and monocrystalline surfaces, the layer having a first portion deposited on the monocrystalline surfaces and a second portion deposited on the non-monocrystalline surfaces; and exposing the substrate and gate stack to an etching gas comprising a first gas comprising hydrogen and a halogen and a second gas comprising at least one of a Group III, IV, or V element to selectively etch the first portion of the layer at a slower rate than the second portion of the layer to form source/drain regions within the etched regions of the substrate.

In some embodiments, an apparatus for processing a substrate may include a process chamber having a substrate support disposed therein; a deposition gas source coupled to the process chamber; an etching gas source coupled to the process chamber, the etching gas source including a hydrogen and halogen gas source and a Group III, IV, or V element gas source; an energy control source to maintain the substrate at a temperature at up to 600 degrees Celsius; and an exhaust system coupled to the process chamber to control the pressure in the process chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of selectively depositing an epitaxial layer are provided herein. The invention methods advantageous provide a suitable selective window between an epitaxial layer and an amorphous and/or polycrystalline layer formed on the surfaces of a substrate at low temperatures (e.g., about 600 degrees Celsius or less).

Figure 1:
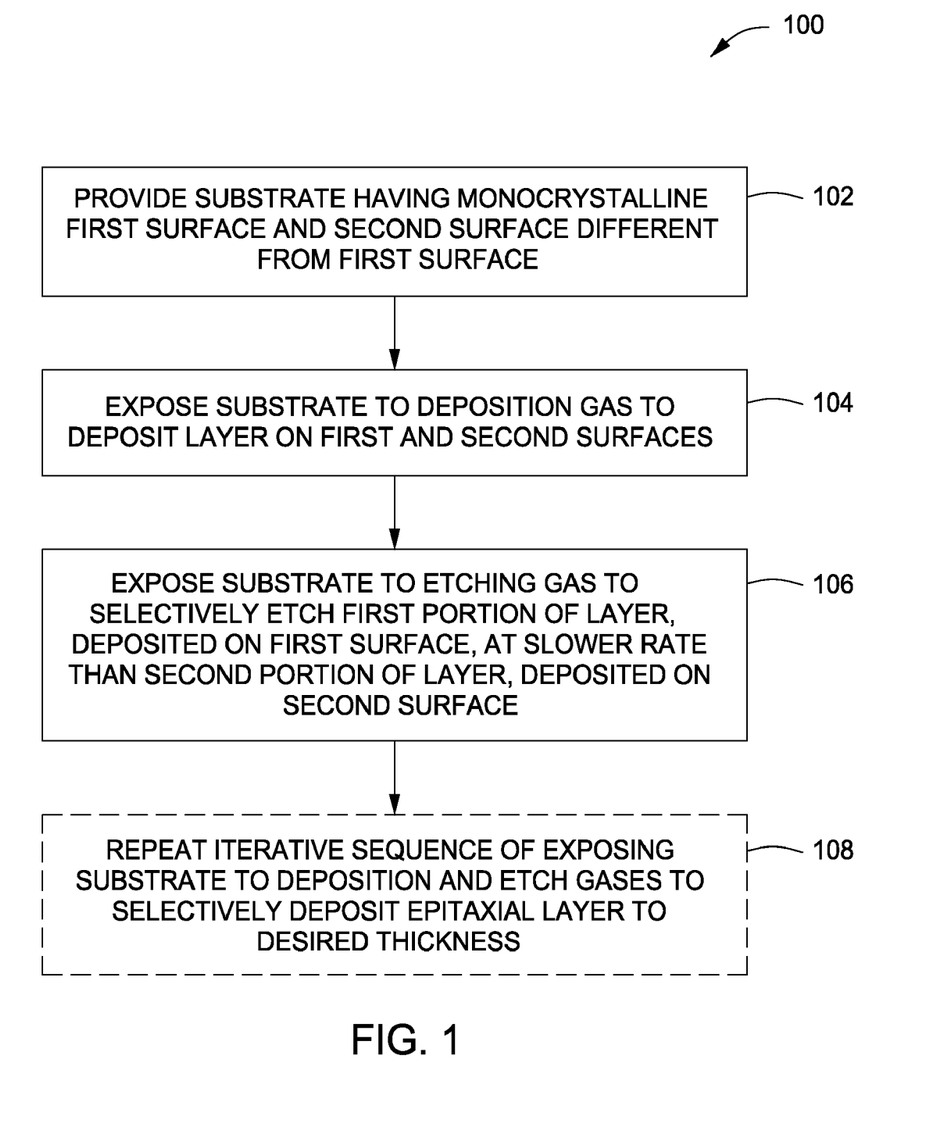
FIG. 1 depicts a flow chart of a method for selectively depositing an epitaxial layer on a substrate in accordance with some embodiments of the present invention

FIG. 1 depicts a flow chart for a method 100 for selectively depositing an epitaxial layer in accordance with some embodiments of the present invention. The method 100 is described below with respect to FIGS. 2-3, which depicts the stages of fabrications of semiconductor structures in accordance with some embodiments of the present invention. The method 100 may be performed in any suitable process chamber configured for selective epitaxial deposition, such as the exemplary epitaxial deposition chamber depicted in FIG. 4, below. The inventive method 100 may be part of a multi-step fabrication process of, for example, a semiconductor device. Accordingly, the exemplary deposition chamber may be coupled to a cluster tool, such as the cluster tool depicted in FIG. 5, below. For example, the cluster tool may include additional process chambers for fabricating a semiconductor device, such as chambers configured for plasma etching, plasma deposition, physical vapor deposition (PVD), chemical vapor deposition (CVD), oxidation, or any suitable chamber necessary for the fabrication of a semiconductor device.

Figure 2A:
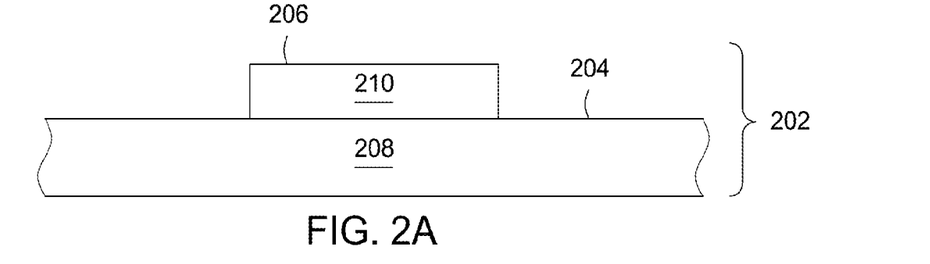
FIGS. 2A-D illustrate stages of fabrication of a semiconductor structure in accordance with some embodiments of the method presented in FIG. 1.

The method 100 begins at 102, by providing a substrate 202 having a monocrystalline first surface 204 and a second surface 206 (as illustrated in FIG. 2A). The second surface 206 may be different from the first surface 204. In some embodiments, the second surface 206 comprises at least one of an amorphous or a polycrystalline surface.

The substrate 202 may further comprise a semiconducting layer 208 having a patterned dielectric layer 210 formed thereon. The semiconductor layer 208 may comprise the monocrystalline first surface 204. In some embodiments, the monocrystalline first surface 204 spans the entirety of the semiconductor layer 208 (as illustrated in FIG. 2A). In some embodiments, the monocrystalline first surface 204 spans only a portion of the semiconductor layer 208 (not shown). For example, a portion may include at least some of the exposed portions (e.g., portions not covered by the dielectric layer 210) of the monocrystalline first surface 204

The patterned dielectric layer 210 may comprise the second surface 206. The patterning of the dielectric layer is such that at least a portion of the monocrystalline first surface 204 is exposed (e.g., not covered by the dielectric layer 210). The patterning of the dielectric layer may be any suitable pattern desired to form a semiconductor device, integrated circuit, or the like.

The semiconductor layer may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor layer is at least one of silicon (Si), n-doped silicon (n-Si), or p-doped silicon (p-Si).

The patterned dielectric layer 210 may comprise any suitable dielectric material and/or combinations of dielectric materials for forming a semiconductor structure. For example, the dielectric layer 210 may comprise one or more dielectric materials such as silicon oxide ($SiO_2$), silicon nitride (SiN), silicon oxynitride (SiON) hafnium oxide ($HfO_2$), aluminum oxide ($Al_2O_3$), undoped silicate glass (USG), phosphor-silicate glass (PSG), boro-phospho-silicate glass (BPSG), carbon-doped silicon nitride (SiN:C), hafnium silicates ($HfSiO_x$) or any suitable dielectric material having at least one surface comprising at least an amorphous or polycrystalline surface. The dielectric layer 210 may, for example, form at least a portion of a gate dielectric layer, a spacer, or other suitable component of a semiconductor device typically formed using dielectric materials.

Figure 2B:
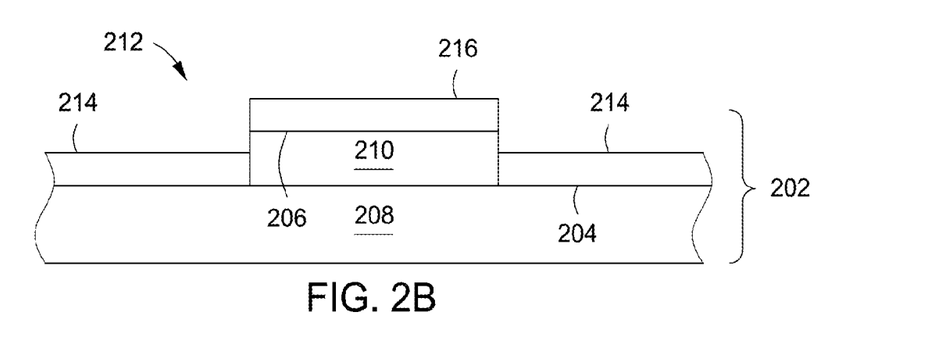

At 104, the substrate 202 is exposed to a deposition gas to deposit a layer 212 on the exposed portion of the monocrystalline first surface 204 of the semiconductor layer 208 and the second surface 206 of the patterned dielectric layer 210 (as illustrated in FIG. 2B). The layer 212 includes a first portion 214, deposited atop the monocrystalline first surface 204, and a second portion 216, deposited atop the second surface 206. In some embodiments, the first portion 214 comprises an epitaxial layer (e.g., crystalline layer). As used herein, an epitaxial layer refers to a single crystal layer (e.g., crystalline layer or monocrystalline layer) having a crystal structure that matches the crystal structure of the surface (e.g., monocrystalline first surface 204) that the epitaxial layer is deposited on. Epitaxial layers may be distinguished from an amorphous layer, e.g., a layer having no long-range order, or a polycrystalline layer, e.g. a layer having multiple crystalline domains ranging in size and crystal orientation. In some embodiments, the second portion 216 comprises at least one of an amorphous or a polycrystalline layer.

The layer 212 may comprise any suitable element and/or combinations of elements capable of forming a crystalline layer (e.g., first portion 214) and at least one of an amorphous or a polycrystalline layer (e.g., second portion 216). Suitable elements may include silicon (Si) and, optionally, one or more of germanium (Ge), carbon (C), phosphorus (P), boron (B), arsenic (As), nitrogen (N), antimony (Sb), gallium (Ga), aluminum (Al), or the like. In some embodiments, the deposited layer 212 may comprise an n-doped silicon-containing material or a p-doped silicon-containing material. In some embodiments, the deposited layer comprises an n-doped silicon-containing material having a high doping level of about $5 \times 10^{19}$ atoms/cm$^3$ or higher, or between about $2 \times 10^{20}$ to about $3 \times 10^{20}$ atoms/cm$^3$, or between about $1 \times 10^{20}$ to about $6 \times 10^{20}$ atoms/cm$^3$ of the dopant. In some embodiments, the layer 212 is n-doped silicon carbon (SiC) where the n-dopant is phosphate (P) doped to a level of $3 \times 10^{20}$ atoms/cm$^3$.

The deposition gas may include any suitable combination of process gases necessary to deposit the layer 212 as described above. For example, the deposition gas may comprise a silicon source, an optional secondary element source (such as a carbon source, germanium source, or the like), and, also optionally, a carrier gas. The deposition gas may further include a dopant source to provide a dopant, such as boron (B), arsenic (As), phosphorus (P), gallium (Ga) and/or aluminum (Al). In some embodiments, for example when depositing an n-doped silicon-containing layer, such as a silicon carbon (SiC) layer having a phosphorus (P) dopant, the deposition gas may include a silicon source, a carbon source, a phosphorus source, and optionally, a carrier gas.

The silicon source may be provided into the process chamber at a rate of about 5 sccm to about 500 sccm, or about 10 sccm to about 300 sccm, or about 50 sccm to about 200 sccm, for example, about 100 sccm. In some embodiments, silane may be flowed at a rate of about 60 sccm. Exemplary silicon sources include silanes, halogenated silanes, and organosilanes. Silanes include silane ($SiH_4$) and higher silanes with the empirical formula $Si_xH_{(2x+2)}$, such as disilane ($Si_2H_6$), trisilane ($Si_3H_8$), tetrasilane ($Si_4H_{10}$), and neopentasilane, as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited layer, for example, a silicon carbon layer.

The silicon source may be provided in combination with a carrier gas. The carrier gas may have a flow rate from about 1 slm (standard liters per minute) to about 100 slm, for example, from about 5 slm to about 75 slm, and more specifically from about 10 slm to about 50 slm, for example, about 10 slm. Carrier gases may include nitrogen ($N_2$), hydrogen ($H_2$), argon, helium, and combinations thereof. A carrier gas may be selected based on the precursor(s) used and/or the process temperature during deposition. The carrier gas may be the same throughout for each of the deposition step at 104 and an etching step, discussed below. However, in some embodiments, different carrier gases may be used in different steps. In one embodiment, methylsilane (($CH_3$)$SiH_3$) in an argon (Ar)-containing carrier gas is used as a silicon-containing source and carrier gas combination.

Nitrogen ($N_2$) may be utilized as a carrier gas in embodiments featuring low temperature (e.g., <800° C.) processes. Nitrogen remains inert during low temperature deposition processes. Therefore, nitrogen is not incorporated into the deposited layer 212 during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface may inhibit the growth rate of the deposited layer 212. Further, the low temperature processes may take economic advantage of nitrogen as a carrier gas, since nitrogen is less expensive than hydrogen, argon, or helium. Despite the economic advantages, in some embodiments, argon (Ar) is utilized as the carrier gas.

The deposition gas may further include a secondary element source in addition to the silicon source and the carrier gas. The secondary element source may include a carbon source and/or a germanium source. For example, a carbon source may be added during deposition with the silicon source and the carrier gas to form a silicon-containing layer, such as a silicon carbon (SiC) layer. The carbon source may be provided at a rate of about 0.1 sccm to about 40 sccm, or about 3 sccm to about 25 sccm, or about 5 sccm to about 25 sccm, for example, about 10 sccm. The carbon source may be diluted in argon or nitrogen gas (for example, about 5 percent carbon source gas in a carrier gas) and flowed at a total rate of about 750 sccm. Exemplary carbon sources may include organosilanes, alkyls, alkenes, and alkynes of ethyl, propyl, and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of the deposited layer 212 may be about 200 ppm to about 5 atomic percent, or about 1 atomic percent to about 3 atomic percent, for example, about 1.5 atomic percent. In some embodiments, the carbon concentration may be graded within the deposited layer 212, for example, having a lower carbon concentration proximate the monocrystalline first surface 204 and the second surface 206 and a greater carbon concentration proximate the terminal surface of the deposited layer 212. Alternatively, a germanium source and a carbon source may both be added during deposition into the process chamber with the silicon source and carrier gas to form a silicon-containing layer, such as a silicon germanium carbon layer.

Alternatively, the secondary element source may be a germanium source added with the silicon source and carrier gas to form a silicon-containing layer, such as a silicon germanium (SiGe) layer. The germanium source may be provided at a rate of about 0.1 sccm to about 20 sccm, or about 0.5 sccm to about 10 sccm, or about 1 sccm to about 5 sccm, for example, about 2 sccm. Germanium sources may include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGeC compounds. The germanium concentration in the deposited layer 212 may be about 1 atomic percent to about 30 atomic percent, for example, about 20 atomic percent. The germanium concentration may be graded within the deposited layer 212, for example, having a higher germanium concentration proximate the monocrystalline first surface 204 and the second surface 206 and a lower germanium concentration proximate the terminal surface of the deposited layer 212.

The deposition gas may further include a dopant source to provide an elemental dopant, such as boron (B), arsenic (As), phosphorus (P), gallium (Ga), or aluminum (Al). Dopants may be utilized to provide the deposited layer 212 with various conductive characteristics, such as directional electron flow in a controlled and desired pathway required by the electronic device. The deposited layer may be doped with a particular dopant to achieve a desired conductive characteristic. For example, a deposited layer 212 comprising a silicon carbon material can be doped n-type, such as with phosphorus, antimony, and/or arsenic to a concentration from about $10^{20}$ atoms/cm$^3$ to about $10^{21}$ atoms/cm$^3$. In some embodiments, the dopant level exceeds about $2 \times 10^{20}$ atoms/cm$^3$.

A dopant source may be provided during deposition at a rate of about 0.1 sccm to about 20 sccm, or about 0.5 sccm to about 10 sccm, or about 1 sccm to about 5 sccm, for example, about 3 sccm. Dopant sources may include arsine ($AsH_3$), phosphine ($PH_3$) and alkylphosphines, such as with the empirical formula $R_xPH_{(3-x)}$, where R=methyl, ethyl, propyl or butyl and x=1, 2, or 3. Alkylphosphines include trimethylphosphine (($CH_3$)$_3P$), dimethylphosphine (($CH_3$)$_2PH$), triethylphosphine (($CH_3CH_2$)$_3P$), and diethylphosphine (($CH_3CH_2$)$_2PH$). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F, and x=0, 1, 2, or 3. Examples of aluminum and gallium dopant sources include trimethylaluminum (($CH_3$)$_3Al$), triethylaluminum (($CH_3CH_2$)$_3Al$), dimethylaluminumchloride (($Ch_3$)$_2AlCl$), aluminum chloride ($AlCl_3$), trimethylgallium (($CH_3$)$_3Ga$), triethylgallium (($CH_3CH_2$)$_3Ga$), dimethylgalliumchloride (($CH_3$)$_2GaCl$), and gallium chloride ($GaCl_3$).

The deposition gas may be provided to the substrate 202 to form the deposited layer 212 at deposition temperatures and pressures suitable for maintaining layer quality and desired critical dimension during deposition. Generally, the deposition temperature may be maintained at about 600° C. or below, or between about 500 to about 600° C., or for example, about 575° C. during deposition. The deposition pressure may be maintained at about 0.1 Torr to 50 Torr, or about 30 to about 80 Torr. In some embodiments, the deposition pressure is maintained at about 10 Torr.

During the deposition, the substrate 202 may be exposed to the deposition gas for a deposition period of about 0.5 seconds to about 30 seconds, or about 1 second to about 20 seconds, or about 5 seconds to about 10 seconds. In some embodiments, the deposition period is about 10 to about 11 seconds. The deposition period may be determined in relation to an etching period used for an etching step, discussed below at 106, and/or in relation to particular deposition source gases and temperature used in the deposition process.

In some embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products, and other contaminants. In an exemplary embodiment, the process chamber may be purged for about 10 seconds by flowing a carrier gas at about 5 slm. A cycle of deposition and purge may be repeated for numerous cycles. In some embodiments, the deposition and purge cycle is repeated up to about 90 times.

Figure 2C:
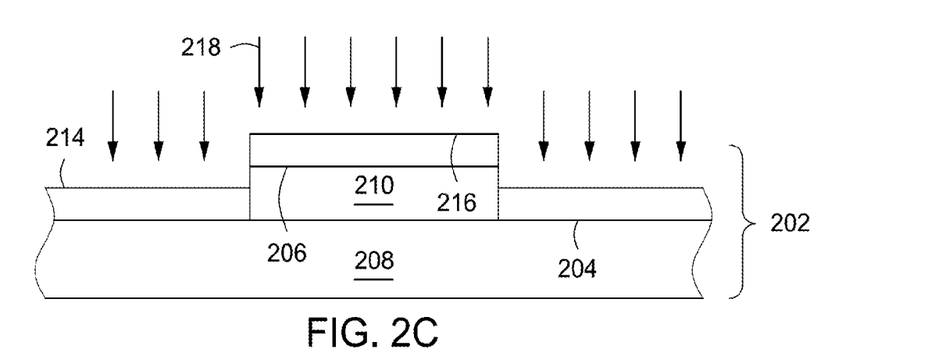
Figure 2D:
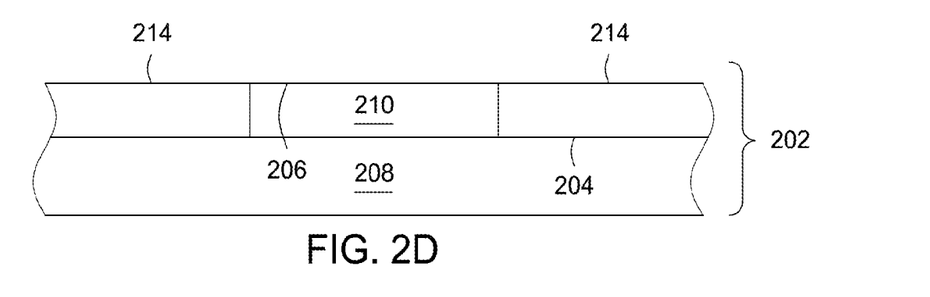

At 106, the substrate 202 may be exposed to an etching gas 218 to selectively etch the first portion 214 of the deposited layer 212, deposited on the monocrystalline first surface 204, at a slower rate than the second portion 216 deposited on the second surface 206 (illustrated in FIG. 2C). The etch process at 106 may be performed simultaneously or alternatively with the deposition process at 104 to selectively form an epitaxial layer (e.g., the first portion 214) on the monocrystalline surface 204.

The etching gas 218 includes a first gas and a second gas. The first gas comprises hydrogen and halogen-containing gas. In some embodiments, the first gas comprises at least one of hydrogen chloride (NCl), hydrogen fluoride (HF), hydrogen bromide (HBr), or hydrogen iodide (HI). In some embodiments, the first gas is HCl. The inventors have found that an etching gas including the first gas comprising hydrogen and halogen, for example, HCl substantially improves etch selectivity for the second portion 216 (e.g., an amorphous or polycrystalline layer) over the first portion 214 (e.g., a crystalline layer) of the deposited layer 212. In some embodiments, the etching gas 218 may have an etch selectivity for the second portion of the deposited layer of between about 2:1 to about 10:1, or up to about 10:1.

While the first gas provides an improved selectivity window, the inventors have found that an etching process using only the first gas requires a processing pressure of at least about 100 Torr, or at least about 10 times the processing pressure of the deposition process at 104. Accordingly, process throughput is slowed by the need to change processing pressures between the deposition step at 104 and the etch step at 106. Further, to achieve a higher processing pressure a significant amount (e.g., about 700 liters per substrate) of the first gas is required. The inventors have discovered that an etching gas further comprising the second gas unexpectedly and significantly lowers the processing pressure required for etching while maintaining the desired etch selectivity for the second portion 216 of the deposited layer 212.

The second gas may comprise at least one of a Group III, IV, or V element of the periodic table of the elements. In some embodiments, the second gas comprises at least one of germane ($GeH_4$), germanium chloride ($GeCl_4$), boron hydride ($BH_3$), boron trichloride ($BCl_3$), phosphine ($PH_3$), phosphorus trichloride ($PCl_3$), or phosphorus pentachloride ($PCl_5$). In some embodiments, the second gas comprises germane ($GeH_4$). In some embodiments, the second gas further includes a carrier gas, such as argon (Ar), helium (He), krypton (Kr), neon (Ne), or the like. In some embodiments, the second gas comprises $GeH_4$ and a carrier gas, where $GeH_4$ is about 1 atomic percent of the second gas.

In some embodiments, the etching gas 218 may be provided at total flow rate of between about 50 to about 5000 sccm, or at about 750 sccm. The first gas may be provided at a flow rate of between about 10 to about 2500 sccm, or about 250 sccm. In some embodiments, the first gas comprises HCl provided at a flow rate of about 250 sccm. The second gas may be provided at a flow rate of between about 10 to about 2500 sccm, or about 500 sccm. In some embodiments, the second gas is provided at a flow rate of about 500 sccm. The etching gas 218 may further include an inert gas, for example, such as nitrogen ($N_2$), or the like. The inert gas may be provided at a flow rate of between about 0.5 to about 10 slm, or at about 3 slm. In some embodiments, the etching gas comprises HCl provided at about 250 sccm, 1% $GeH_4$ provided at about 500 sccm, and $N_2$ provided at a flow rate of about 3 slm.

The etching gas 218 may be provided to the substrate 202 to selectively etch the deposited layer 212 at etching temperatures and pressures substantially equivalent to those used during deposition at 104. Generally, the etching temperature may be maintained at about 600° C. or below, or between about 500 to about 600° C., or for example, about 575° C. The etching pressure may be maintained at about 0.1 Torr to 150 Torr, or about 30 to about 120 Torr. In some embodiments, the etching pressure is maintained at about 80 Torr.

During the etching process, the substrate 202 may be exposed to the etching gas for an etching period of about 0.5 seconds to about 30 seconds, or about 1 second to about 20 seconds, or about 5 seconds to about 10 seconds. In some embodiments, the etching period is about 10 to about 11 seconds. The etching period may be determined in relation to the deposition period used for the deposition step, as discussed above at 104, and/or in relation to particular etching gases and temperature used in the etching process.

In some embodiments, after the etching process is terminated, the process chamber may be flushed with a purge gas or the carrier gas and/or the process chamber may be evacuated with a vacuum pump. The purging and/or evacuating processes remove excess etching gas, reaction by-products, and other contaminants. In an exemplary embodiment, the process chamber may be purged for about 10 seconds by flowing a carrier gas at about 5 slm. A cycle of etching and purge may be repeated for numerous cycles. In some embodiments, the etching and purge cycle is repeated up to about 90 times.

The etching gas 218 provides an etch selectively for the second portion (e.g., an amorphous or polycrystalline layer) of between about 2:1 to about 10:1 at the etching pressure and temperature conditions discussed above. In some embodiments, an etch rate of about 200 Angstroms/minute for an amorphous layer (e.g., the second portion 216) is obtained using the etching gas 218. In some embodiments, an etch rate of about 25 Angstroms/minute for a crystalline layer (e.g., the first portion 214) is obtained using the etching gas 218.

The method 100 generally ends when the second portion 216 of the deposited layer 212 has been selectively removed from the second surface 206 and the epitaxial layer, e.g., the first portion 214 of the deposited layer 212 remains on the monocrystalline first surface 204 of the substrate 202 (illustrated in FIG. 2D) at a desired thickness. As discussed above, the deposition and etch steps may be performed simultaneously or alternatively to achieve an epitaxial layer selectively deposited to a desired thickness. In some embodiments, the desired thickness of the epitaxial layer may be between about 25 to about 150 nm.

For example, optionally at 108, the method 100 may further include repeating an iterative sequence of exposing the substrate 202 to the deposition and etching gases to selectively deposit the epitaxial layer to the desired thickness. Exemplary alternating deposition and etch processes that may be modified in accordance with the teachings provided herein are disclosed in commonly assigned U.S. Pat. No. 7,312,128, issued Dec. 25, 2007 to Yihwan Kim, et al., and entitled, "Selective Epitaxy Process With Alternating Gas Supply," the entire content of which is incorporated herein by reference. Alternatively, the deposition and etching gases may be provided simultaneously until the desired thickness is obtained.

Figure 3:
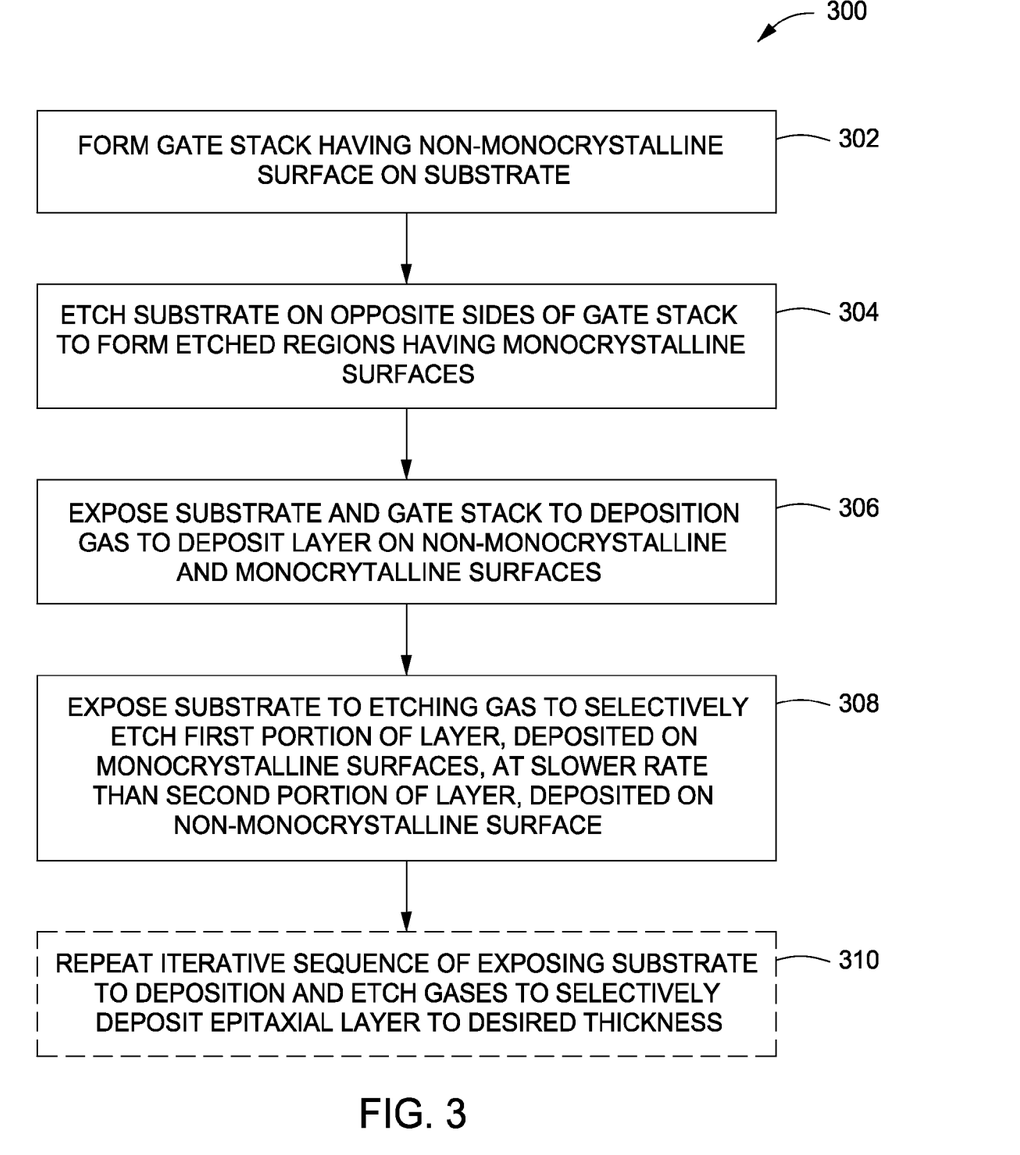
FIG. 3 depicts a flow chart of a method for fabricating a semiconductor device in accordance with some embodiments of the present invention.

FIG. 3 depicts a flow chart for a method 300 for fabricating a semiconductor device. The method 300 may be substantially similar to the method 100 in terms of the deposition, etching, and optional iterative sequence at 104, 106, and 108 respectively. The method 300 may be utilized, for example, to selectively deposit source/drain regions in a semiconductor device, such as a semiconductor device 400. The method 300 is described with respect to FIGS. 4A-C, which depict the stages of selectively depositing source/drain regions in the device 400.

Figure 4A:
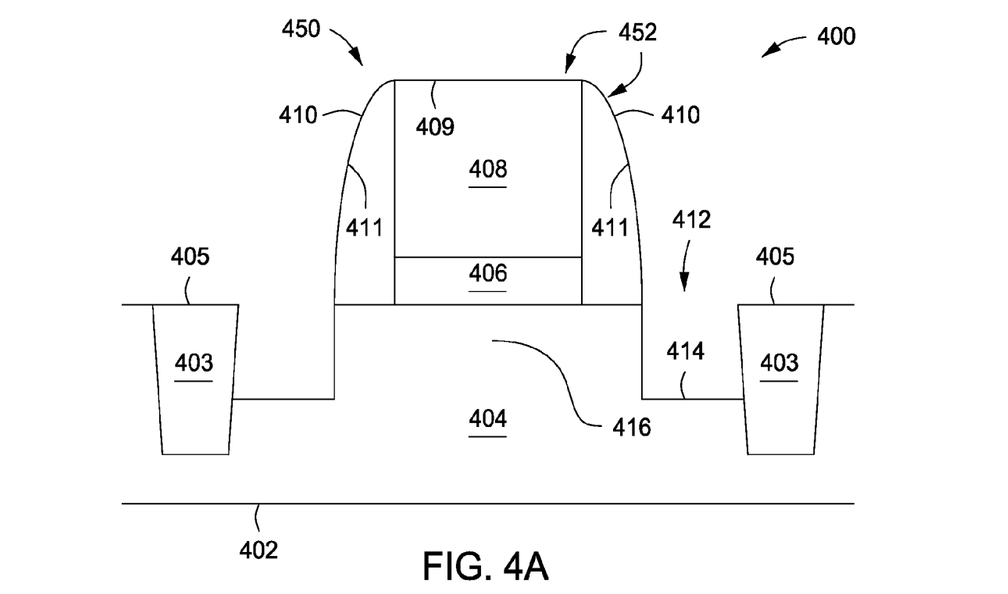
FIG. 4A-C illustrate stages of fabrication of a semiconductor structure in accordance with some embodiments of the method presented in FIG. 3.

For example, the device 400 may be a complementary metal-oxide semiconductor (CMOS) device, such as silicon-containing metal oxide semiconductor field effect transistor (MOSFET) device. Such MOSFET transistors may include p-channel MOS transistors, and n-channel MOS transistors. The PMOS transistor has a p-type source/drain region separated by an n-type channel (e.g., holes are responsible for conduction in the channel between the source/drain regions). The NMOS transistor has an n-type source/drain region separated by a p-type channel (e.g., electrons are responsible for conduction in the channel between the source/drain regions). The exemplary device 400 is described below in accordance with an NMOS transistor, however, the inventive method 300 may be similarly applied to a PMOS transistor, as well as any suitable semiconductor devices. The device 400 includes a substrate 402 having a gate stack 450 disposed thereon.

The method 300 begins at 302 by forming the gate stack 450 having a non-monocrystalline surface 452 on the substrate 402. The term "non-monocrystalline" is substantially equivalent to "amorphous" and/or "polycrystalline" as discussed above. The substrate 402 may be substantially similar in composition the semiconductor layer 202 as discussed above. The substrate 402 may include other structures or layers at least partially formed thereon. For example, as shown in FIG. 4A, the substrate 402 may include a p-type region 404 defined therein and having the gate stack 450 partially fabricated atop the p-type region 404. In some embodiments, such as where one or more transistors are being formed on the substrate 402, a plurality of field isolation regions 403 may be formed in the substrate 402 to isolate wells having different conductivity types (e.g., n-type or p-type) and/or to isolate adjacent transistors. The field isolation regions 403 may be shallow trench isolation (STI) structures formed, for example, by etching a trench into the substrate 403 and then filling the trench with a suitable insulator, such as silicon oxide (oxide), silicon nitride (nitride), or the like. The field isolation regions 403 include a first surface 405. The first surface 405 may include at least one of an amorphous or polycrystalline surface.

The p-type region 404 may be formed by one or more implant processes using a suitable dopant, such as boron, or indium into the substrate 402. The p-type region 404 may also be formed by other means including providing an initially doped substrate, or depositing an in situ doped semiconductor material with a desired conductivity. The p-type region 404 may have a doping density, for example, of between about $5\times10^{16}$ atoms/cm$^3$ and about $5\times10^{19}$ atoms/cm$^3$.

The gate stack 450 may include a gate dielectric layer 406 formed on the substrate 400 atop the p-type region 404. The gate dielectric layer 406 may comprise, for example, one or more silicon oxide ($SiO_2$), silicon nitride (SiN), silicon oxynitride (SiON), hafnium oxide ($HfO_2$), or aluminum oxide ($Al_2O_3$) layers, which, for example, may be deposited to a thickness between about 0.5 nm and about 20 nm. A gate electrode 408 may be formed on the gate dielectric layer 406. The gate electrode 408 may be formed from suitable conductive materials, such as metals, polysilicon, or the like. In some embodiments, the gate electrode may be between about 100 nm and about 350 nm thick. Optionally, a hard mask layer (not shown) may be deposited atop the gate electrode 408. The optional hard mask layer includes at least one of an amorphous or polycrystalline surface (not shown). The gate electrode 408 further comprises a first surface 409, where the first surface 409 comprises a portion of the non-monocrystalline surface 452 of the gate electrode 450. The first surface 409 includes at least one of an amorphous or polycrystalline surface.

The gate stack 450 may further comprise sidewall spacers 410, which may be formed along the outer sidewalls of the gate electrode 408 and the gate dielectric layer 406. The sidewall spacers 410 may be formed, for example, to a thickness between about 5 nm and about 30 nm, or any other thickness suitable to electrically isolate the gate electrode 408 from subsequently deposited material. The sidewall spacers 410 may comprise suitable insulating materials, for example, silicon nitride, silicon oxide, silicon oxynitride, silicon carbide, or the like. The sidewall spacers 410 may be deposited by any suitable process, such as chemical vapor deposition, and may be formed such that outer edges of the sidewall spacers 410 taper near the topmost surface of the gate electrode 408 as shown in FIG. 4A. The sidewall spacers 410 further comprises a first surface 411, where the first surface 411 comprises a portion of the non-monocrystalline surface 452 of the gate electrode 450. The first surface 411 includes at least one of an amorphous or polycrystalline surface.

At 304, the substrate 402 is etched on opposing sides of the gate stack 450 to form etched regions 412 having monocrystalline surfaces 414. The p-type region 404 of the substrate 402 may be etched by any suitable etch process to form etched regions 412 disposed on opposite sides of the gate stack 450, thereby defining a channel 416 of the transistor therebetween. In embodiments where the substrate 402 is etched, the optional hard mask layer may be used to protect the gate electrode 408 from being etched.

The substrate 402 may be etched vertically to form the etched regions 412 into the p-type region 404. Optionally, the substrate 402 may also be etched laterally to form recesses (not shown), which extend horizontally beneath the sidewall spacers 410 and the gate dielectric layer 406. The etched regions 412 (and optionally recesses) may have any suitable dimensions, for example, a depth of between about 5 nm and about 150 nm, and a width that may be as large as a distance between the isolation structure 403 to the gate dielectric 406, or less as necessary (such as, for example, between about 25 and about 2500 nm).

Figure 4B:
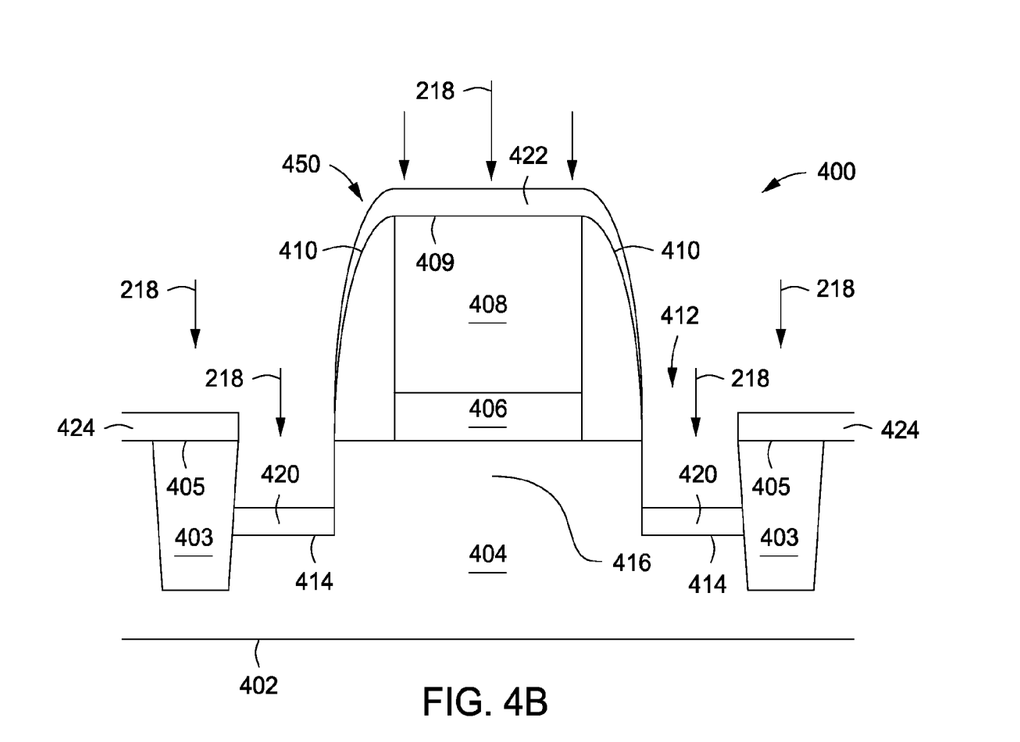

At 306, the substrate 402 and the gate stack 450 are exposed to a deposition gas to deposit a layer 418 atop the substrate 402 and the gate stack 450 (illustrated in FIG. 4B). The layer 418 includes a first portion 420 deposited atop the monocrystalline surfaces 414 of the etched regions 412 and a second portion 422 deposited atop the non-monocrystalline surface 452 of the gate stack 450. The second portion 422 may cover the non-monocrystalline surface 452 entirely, or tapper off as the surface 452 becomes more vertical (as shown). The layer 418 may further include a third portion 424 deposited atop the first surface 409 of the field isolation regions 403. The deposition gas, pressure, and temperature, duration, and other processing conditions and steps related to deposition are substantially equivalent to those steps and conditions discussed above at 104.

The layer 418 further includes monocrystalline and non-monocrystalline portions, similar to the layer 212 discussed above. For example, the first portion 420 deposited on the monocrystalline surfaces 414 of the etched regions 412 may be a monocrystalline layer (e.g., an epitaxial layer). The second portion 422, deposited atop the non-monocrystalline surface 452, and the third portion 424, deposited atop the first surface 409 of the field isolation region 403, may be non-monocrystalline (e.g., amorphous and/or polycrystalline layers).

At 308, the substrate and the gate stack 450 are exposed to an etching gas (e.g., etching gas 218) to selectively etch the first portion 420 (e.g., an epitaxial layer), deposited on the monocrystalline surfaces 414, at a slower rate than the second portion 422 (e.g., an amorphous or polycrystalline layer), deposited on the non-monocrystalline surface 452 (illustrated in FIG. 2B). Further, the etching gas 218 may further selectively etch the first portion 420 at a slower rate than the third portion 424 (e.g., an amorphous or polycrystalline layer), deposited on the first surface 409 (e.g., a non-monocrystalline surface) of the field isolation region 403. The etching gas 218, etching pressure and temperature, duration, etching rates, etch selectivity and other processing conditions and steps related to etching are substantially equivalent to those steps and conditions discussed above at 106. Similar to steps 104 and 106 of the method 100, the deposition and etching steps at 306 and 308 can be performed simultaneously or alternatively to selectively deposit an epitaxial layer (e.g., first portion 420) in the etched regions 412 of the device 400.

Figure 4C:
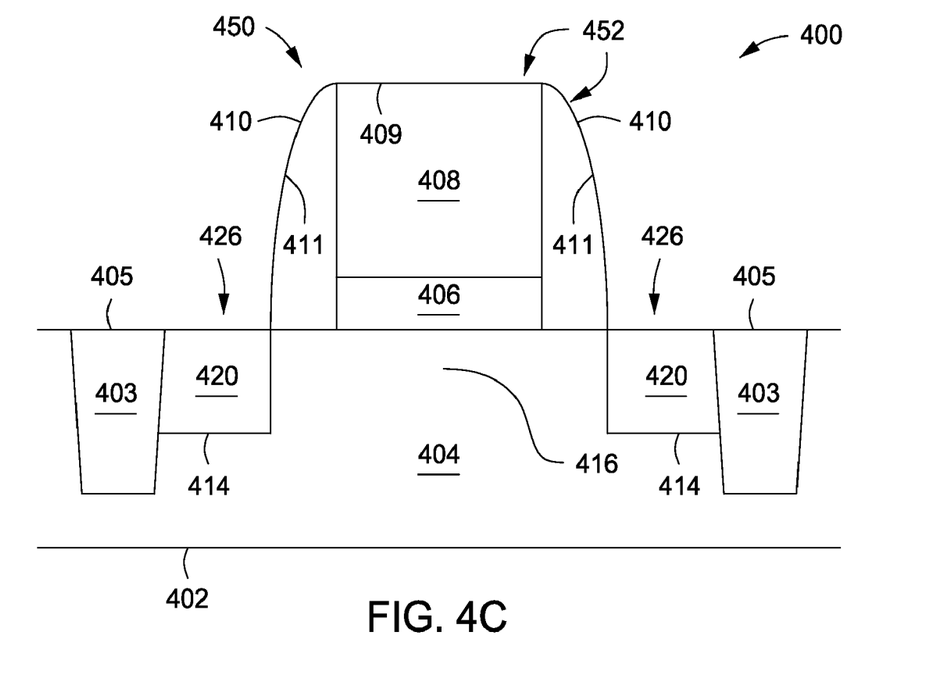

The method 300 generally ends when the second portion 422 and third portion 424 of the deposited layer 418 has been selectively removed from the non-monocrystalline surfaces of the gate stack 452 and the field isolation region 403 and the epitaxial layer (e.g., the first portion 422 of the deposited layer 418) remains on the monocrystalline surfaces 414 of the etched regions 412 to form source/drain regions 426 of the device 400 (illustrated in FIG. 4C). As discussed above, the deposition and etch steps may be performed simultaneously or alternatively to achieve an epitaxial layer selectively deposited to a desired thickness, such as a desired thickness of the source/drain regions. For example, and optionally at 310, the method 300 may further include repeating an iterative sequence of exposing the substrate 402 and the gate stack 450 to the deposition and etching gases to selectively deposit the epitaxial layer (e.g., form the source/drain regions) to the desired thickness. In some embodiments, the source/drain regions 426 may be n-doped silicon carbon (SiC). In some embodiments, the n-dopant may further include phosphorus (P). In some embodiments, the dopant level of the source/drain regions is about 0.5 percent.

The inventive processes disclosed herein may be performed in any suitable semiconductor process chamber adapted for performing epitaxial silicon deposition processes, such as the RP EPI® reactor, available from Applied Materials, Inc. of Santa Clara, Calif. An exemplary process chamber is described below with respect to FIG. 5, which depicts a schematic, cross-sectional view of a semiconductor substrate process chamber 500 suitable for performing portions of the present invention. The process chamber 500 may be adapted for performing epitaxial silicon deposition processes as discussed above and illustratively comprises a chamber body 510, support systems 530, and a controller 540.

Figure 5:
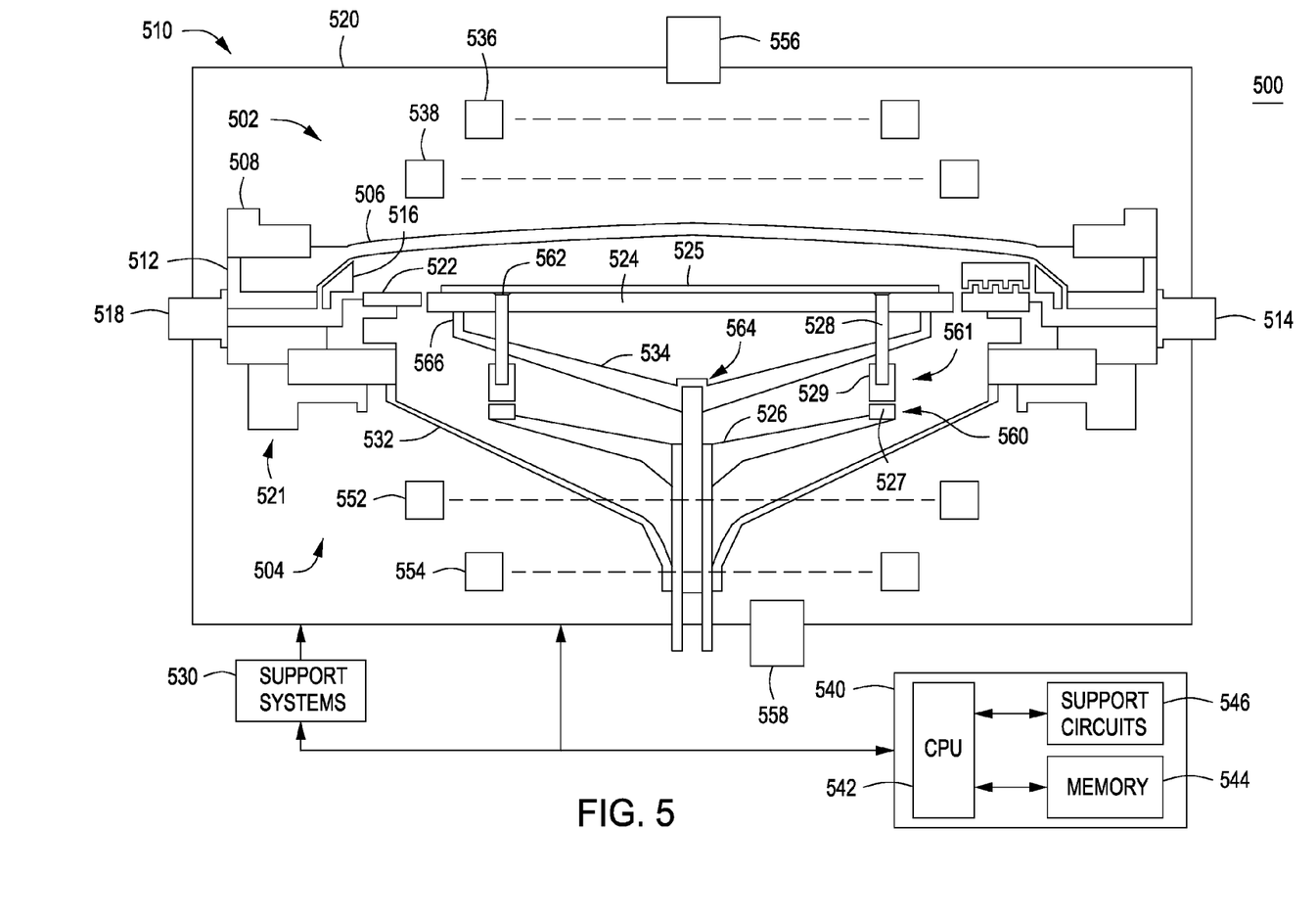
FIG. 5 illustrates an epitaxial deposition chamber in accordance with some embodiments of the present invention.

The chamber body 510 generally includes an upper portion 502, a lower portion 504, and an enclosure 520. The upper portion 502 is disposed on the lower portion 504 and includes a lid 506, a clamp ring 508, a liner 516, a baseplate 512, one or more upper lamps 536 and one or more lower lamps 538, and an upper pyrometer 556. In one embodiment, the lid 506 has a dome-like form factor, however, lids having other form factors (e.g., flat or reverse curve lids) are also contemplated. The lower portion 504 is coupled to a process gas intake port 514 and an exhaust port 518 and comprises a baseplate assembly 521, a lower dome 532, a substrate support 524, a pre-heat ring 522, a substrate lift assembly 560, a substrate support assembly 564, one or more upper lamps 552 and one or more lower lamps 554, and a lower pyrometer 558. Although the term "ring" is used to describe certain components of the process chamber, such as the pre-heat ring 522, it is contemplated that the shape of these components need not be circular and may include any shape, including but not limited to, rectangles, polygons, ovals, and the like.

During processing, a substrate 525 (e.g., substrate 202, 402) is disposed on the substrate support 524. The lamps 536, 538, 552, and 554 are sources of infrared (IR) radiation (e.g., heat) and, in operation, generate a pre-determined temperature distribution across the substrate 525. The lid 506, the clamp ring 516, and the lower dome 532 are formed from quartz; however, other IR-transparent and process compatible materials may also be used to form these components.

The substrate support assembly 564 generally includes a support bracket 534 having a plurality of support pins 566 coupled to the substrate support 524. The substrate lift assembly 560 comprises a substrate lift shaft 526 and a plurality of lift pin modules 561 selectively resting on respective pads 527 of the substrate lift shaft 526. In some embodiments, a lower portion of the lift pin module 561 may rest in a base 529 that engages the respective pads 527. In some embodiments, each lift pin module 561 comprises an optional upper portion of the lift pin 528 that is movably disposed through a first opening 562 in the substrate support 524. In operation, the substrate lift shaft 526 is moved to engage the lift pins 528. When engaged, the lift pins 528 may raise the substrate 525 above the substrate support 524 or lower the substrate 525 onto the substrate support 524.

The support systems 530 include components used to execute and monitor pre-determined processes (e.g., growing epitaxial silicon films) in the process chamber 500. Such components generally include various sub-systems. (e.g., gas panel(s), gas distribution conduits, vacuum and exhaust sub-systems, and the like) and devices (e.g., power supplies, process control instruments, and the like) of the process chamber 500. These components are well known to those skilled in the art and are omitted from the drawings for clarity.

The controller 540 generally comprises a central processing unit (CPU) 542, a memory 544, and support circuits 546 and is coupled to and controls the process chamber 500 and support systems 530, directly (as shown in FIG. 5) or, alternatively, via computers (or controllers) associated with the process chamber and/or the support system components. The controller 540 may be one of any form of general-purpose computer processor that can be used in an industrial setting for controlling various chambers and sub-processors. The memory, or computer-readable medium, 544 of the controller 540 may be one or more of readily available memory such as random access memory (RAM), read only memory (ROM), floppy disk, hard disk, flash, or any other form of digital storage, local or remote. The support circuits 546 are coupled to the CPU 542 for supporting the processor in a conventional manner. These circuits include cache, power supplies, clock circuits, input/output circuitry and subsystems, and the like. Inventive methods as described herein may be stored in the memory 544 as software routine that may be executed or invoked to control the operation of the process chamber in the manner described herein. The software routine may also be stored and/or executed by a second CPU (not shown) that is remotely located from the hardware being controlled by the CPU 542.

The process chamber 500 may be incorporated into a cluster tool. One well-known cluster tools which may be adapted for the present invention is the Centura®, which is available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present epitaxial growth process.

Figure 6:
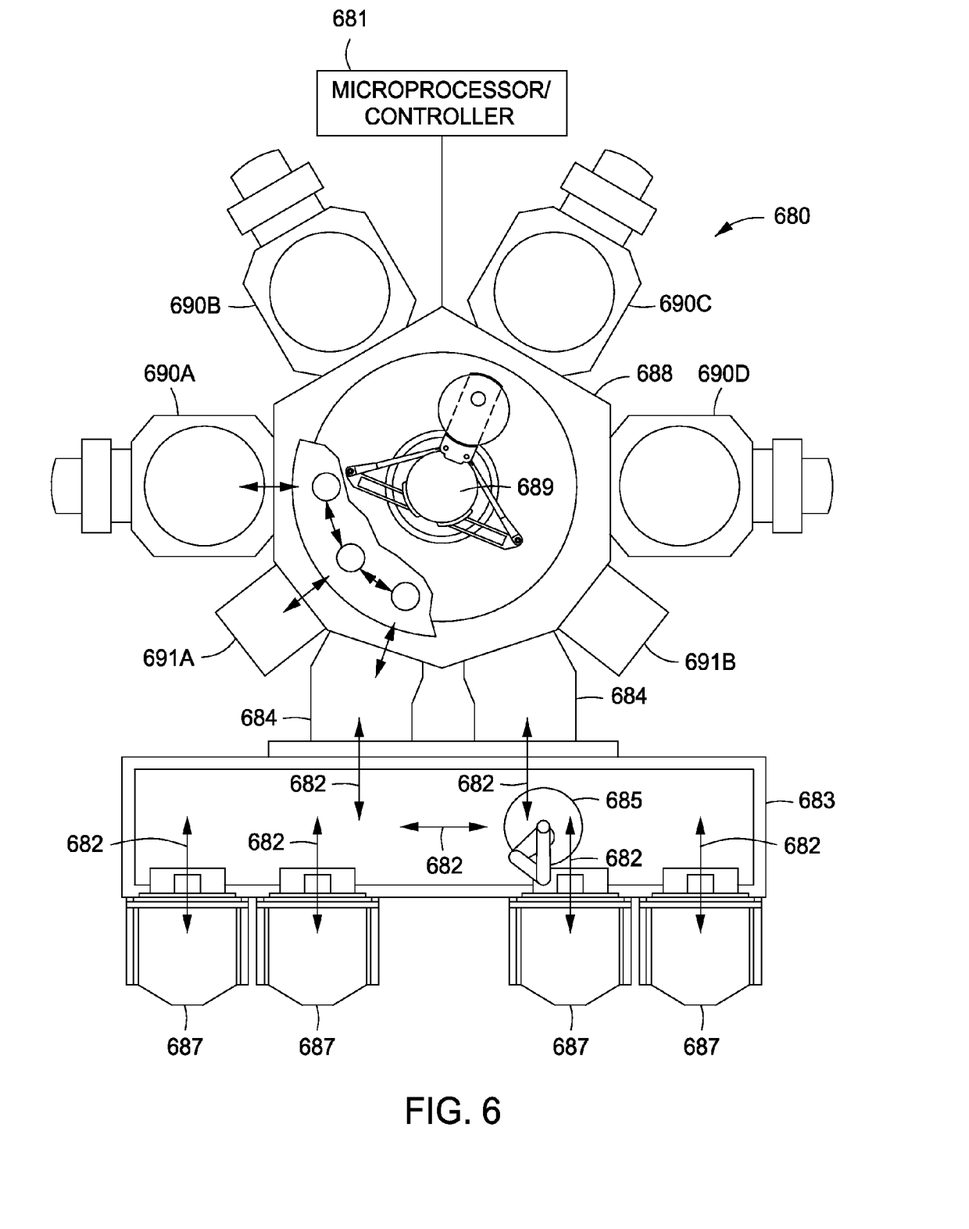
FIG. 6 illustrates a cluster tool in accordance with some embodiments of the present invention.

FIG. 6 depicts a cluster tool suitable for performing portions of the present invention. Generally, the cluster tool is a modular system comprising multiple chambers (e.g., process chambers 690A-D, service chambers 691A-B, or the like) which perform various functions including substrate center-finding and orientation, degassing, annealing, deposition and/ or etching. According to embodiments of the present invention, the cluster tool may include at least a semiconductor substrate process chamber configured to perform the inventive selective epitaxial deposition methods 100 and 300 and may further include chambers such as ion implantation chambers, etch chambers, and the like. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 680 is shown in a plan view in FIG. 6. The cluster tool 680 generally comprises a plurality of chambers and robots and is preferably equipped with a microprocessor controller 681 programmed to carry out the various processing methods performed in the cluster tool 680. A front-end environment 683 is shown positioned in selective communication with a pair of load lock chambers 684. A pod loader 685 disposed in the front-end environment 683 is capable of linear and rotational movement (arrows 682) to shuttle cassettes of substrates between the load locks 684 and a plurality of pods 687 which are mounted on the front-end environment 683. The load locks 684 provide a first vacuum interface between the front-end environment 683 and a transfer chamber 688. Two load locks 684 are provided to increase throughput by alternatively communicating with the transfer chamber 688 and the front-end environment 683. Thus, while one load lock 684 communicates with the transfer chamber 688, a second load lock 684 communicates with the front-end environment 683. A robot 689 is centrally disposed in the transfer chamber 688 to transfer substrates from the load locks 684 to one of the various processing chambers 690A-D and service chambers 691A-B. The processing chambers 690A-D may perform various processes such as physical vapor deposition, chemical vapor deposition, etching, and the like, while the service chambers 691 may be adapted for degassing, orientation, cooldown, and the like.

For the purposes of practicing embodiments of the present invention, at least one of the processing chambers (for example, 690A) may be configured similar to the exemplary semiconductor substrate process chamber 500, illustrated in FIG. 5. Another at least one of the processing chambers (for example, 690B) may be a plasma etch chamber adapted to etch the substrate 402 to form etched regions 412 in the p-type region 404 in accordance with embodiments of the present invention. Accordingly, following an etch of the substrate 402, the substrate may be removed from the plasma etch chamber and transported to the process chamber 690A by the robot 689 to form the first and one or more second silicon layers.

Thus, methods of selectively depositing an epitaxial layer are provided herein. The inventive methods advantageously provide a suitable selective window between an epitaxial layer and an amorphous and/or polycrystalline layer formed on the surfaces of a substrate at low temperatures (e.g., about 600 degrees Celsius or less) while enhancing process throughput and reducing process gas use.

While the foregoing is directed to embodiments of the present invention, other and further embodiments of the invention may be devised without departing from the basic scope thereof.

The invention claimed is:

1. A method for selectively depositing an epitaxial layer on a substrate, comprising:
    providing a substrate having a monocrystalline first surface and a non-monocrystalline second surface;
    exposing the substrate to a deposition gas to deposit a layer on the first and second surfaces, the layer comprising a first portion deposited on the monocrystalline first surface and a second portion deposited on the non-monocrystalline second surface; and
    exposing the substrate to an etching gas separately from the deposition gas, the etching gas comprising a first gas comprising hydrogen and a halogen and a second gas comprising a Group V element to selectively etch the first portion of the layer at a slower rate than the second portion of the layer.

2. The method of claim 1, wherein the first gas comprises at least one of hydrogen chloride (HCl), hydrogen fluoride (HF), hydrogen bromide (HBr), or hydrogen iodide (HI).

3. The method of claim 1, wherein the second gas comprises at least one of phosphine ($PH_3$), phosphorus trichloride ($PCl_3$), or phosphorus pentachloride ($PCl_5$).

4. The method of claim 1, wherein the etchant gas comprises hydrogen chloride (HCl).

5. The method of claim 1, further comprising:
    flowing the first gas at a flow rate of between about 10 to about 2500 sccm; and
    flowing the second gas at a flow rate of between about 10 to about 2500 sccm.

6. The method of claim 1, wherein the etching gas has an etch selectivity for the second portion of the layer of about 2:1 to about 10:1.

7. The method of claim 1, wherein the deposition gas comprises a silicon source, a carbon source, and an n-type dopant source.

8. The method of claim 1, further comprising:
    maintaining a processing pressure at about 150 Torr or below while exposing the substrate to the deposition and etching gases; and maintaining the substrate at a temperature of about 600 degrees Celsius or below while exposing the substrate to the deposition and etching gases.

9. The method of claim 1, wherein the substrate further comprises:
a semiconducting layer comprising the monocrystalline first surface; and
a patterned dielectric layer formed atop a portion of the semiconducting layer, wherein the patterned dielectric layer comprises the second surface.

10. The method of claim 9, wherein the semiconducting layer includes at least one of silicon (Si), n-doped silicon (n-Si), p-doped silicon (p-Si), or silicon germane alloys, and wherein the patterned dielectric layer includes at least one of silicon oxide ($SiO_2$), hafnium oxide ($HfO_2$), aluminum oxide ($Al_2O_3$), silicon nitride (SiN), silicon oxynitride (SiON), undoped silicate glass (USG), phosphor-silicate glass (PSG), boro-phospho-silicate glass (BPSG), carbon-doped silicon nitride (SiN:C), or hafnium silicate ($HfSiO_x$).

11. The method of claim 1, further comprising:
repeating an iterative sequence of exposing the substrate to the deposition and etching gases to selectively deposit the layer to a desired thickness.

12. The method of claim 1, wherein the first portion of the layer comprises a monocrystalline layer, and wherein the second portion of the layer comprises at least one of a polycrystalline or an amorphous layer.

13. The method of claim 1, wherein the deposited layer comprises silicon and carbon, wherein a carbon content is between about 0.3 to about 3 atomic percent.

14. The method of claim 13, wherein the deposited layer further comprises an n-type dopant.

15. The method of claim 13, wherein the deposited layer is an n-doped silicon carbon layer having a doping level of about 0.5 percent.

16. A method of fabricating a semiconductor device, comprising:
forming a gate stack having a non-monocrystalline surface on a substrate;
etching the substrate on opposite sides of the gate stack to define etched regions where a source and a drain region is to be formed, wherein the etched regions formed in the substrate have monocrystalline surfaces;
exposing the substrate and gate stack to a deposition gas to deposit a layer on the non-monocrystalline and monocrystalline surfaces, the layer having a first portion deposited on the monocrystalline surfaces and a second portion deposited on the non-monocrystalline surfaces; and
exposing the substrate and gate stack to an etching gas separately from the deposition gas, the etching gas comprising a first gas comprising hydrogen and a halogen and a second gas comprising a Group V element to selectively etch the first portion of the layer at a slower rate than the second portion of the layer to form source/drain regions within the etched regions of the substrate.

17. The method of claim 16, wherein the gate stack further comprises:
a gate dielectric layer deposited atop the substrate;
a polycrystalline gate electrode deposited atop the gate dielectric layer; and
dielectric spacers on opposing sides of the polycrystalline gate electrode and gate dielectric layer, wherein the surfaces of the polycrystalline gate electrode and the dielectric spacers comprise the non-monocrystalline surface.

18. The method of claim 16, wherein the first gas comprises hydrogen chloride (HCl).

19. The method of claim 1, wherein the second gas further comprises at least one of a Group III or IV element.

20. The method of claim 16, wherein the second gas comprises at least one of phosphine ($PH_3$), phosphorus trichloride ($PCl_3$), or phosphorus pentachloride ($PCl_5$).

* * * * *

UNITED STATES PATENT AND TRADEMARK OFFICE
CERTIFICATE OF CORRECTION

PATENT NO. : 8,207,023 B2
APPLICATION NO. : 12/849387
DATED : June 26, 2012
INVENTOR(S) : Zhiyuan Ye et al.

Page 1 of 1

It is certified that error appears in the above-identified patent and that said Letters Patent is hereby corrected as shown below:

In the Claims:

In column 14, line 51, Claim 4, delete "etchant" and insert --etching--, therefore, In column 15, line 13, Claim 10, delete "germane" and insert --germanium--, therefore.

Signed and Sealed this
Third Day of September, 2013

Teresa Stanek Rea
*Acting Director of the United States Patent and Trademark Office*